United States Patent

Nagasaki

[11] Patent Number: 6,108,190
[45] Date of Patent: Aug. 22, 2000

[54] WAFER HOLDING DEVICE

[75] Inventor: Koichi Nagasaki, Kokubu, Japan

[73] Assignee: Kyocera Corporation, Kyoto, Japan

[21] Appl. No.: 09/201,625

[22] Filed: Nov. 30, 1998

[30] Foreign Application Priority Data

Dec. 1, 1997 [JP] Japan .................................. 9-330680

[51] Int. Cl.$^7$ .................................................. H01G 23/00
[52] U.S. Cl. .......................................................... 361/234
[58] Field of Search .................................. 361/230–235; 279/128

[56] References Cited

U.S. PATENT DOCUMENTS

| | | | |
|---|---|---|---|
| 5,078,851 | 1/1992 | Nishihata et al. ................. | 204/298.34 |
| 5,155,652 | 10/1992 | Logan et al. ............................. | 361/234 |
| 5,191,506 | 3/1993 | Logan et al. ............................. | 361/234 |
| 5,794,838 | 8/1998 | Ushikoshi et al. ...................... | 228/121 |

*Primary Examiner*—Stephen W. Jackson
*Attorney, Agent, or Firm*—Hogan & Hartson LLP

[57] ABSTRACT

A wafer holding device is provided, which comprised a wafer holding stage of ceramics having a internal electrode and a top surface on which at least a wafer is to be mounted, a base block supporting said stage integrated thereto, and a braze material layer to join the stage and the base block therebetween which the layer is interposed, wherein the base block is formed a porous ceramics and a metal filled in pores of the ceramics, the porous ceramics has a thermal expansion coefficient within $3\times10^{-6}/°$ C. of the difference of the thermal expansion coefficient with respect to the ceramics of the stage, and the braze material layer comprises a aluminum-based braze material.

7 Claims, 3 Drawing Sheets

X — X

WAFER HOLDING DEVICE

BACKGROUND OF THE INVENTION

1. Field of the Invention

The present invention relates to a wafer holding device which is used in the filmmaking, etching and exposure apparatuses in semiconductor manufacturing processes.

2. Prior Art

In the process of fabricating the semiconductor devices, various kind of wafer holding devices have been used for holding wafers, especially, semiconductor wafers, in the semiconductor treating apparatuses. such apparatuses include a filmmaking apparatus for forming thin films onto the wafers, a etching apparatus for micro-etching or cutting the surface of the wafers and an exposure apparatus for emitting light to the photo-resist resin attached on the wafer prior to etching.

For example, the wafer holding device having a stage made of ceramics are known, which has a top surface as a holding surface for mounting the wafer to be treated. A parallel electrode to the surface is buried in the ceramic body to attract the wafer to the wafer holding device due to attracting force such as Coulomb force by dielectric polarization and Johnson-Rahbeck force by the leakage current, by applying the direct current to the electrode. As another example, the device having an heating function of the buried electrode is also known, in which alternative current are supplied between the electrode and the wafer set on the surface to heat said wafer. Further, it is known that another device with plasma generating mechanism has another electrode together with the buried electrode and high frequency current is supplied therebetween to generate plasma. The wafer holding devices provided with all these functions and mechanisms also are known.

For these devices, non-uniform distribution of the temperature on the holding surface of the device greatly affects the precision of forming and treating of the wafers in each of filmmaking, etching and exposure steps during semiconductor manufacturing processes. Then, in order to control the temperature of the holding surface of the device, for some wafer holding devise, a metal base has been attached under the stage of a ceramics body, which has heating or cooling function.

As method of joining the metal stage and the ceramic base of the device, fastening them with bolts embedded in the ceramics and nuts screwed to the bolts passing through the plate has been adopted.

The Japanese Patent Publication No.JP-A 2-27748 discloses another method which adhere a stage and a metal base with an adhesive resin material.

However, in the method of fastening with bolts, it is easy to work for fastening but a clearance is apt to occur between the metal base and the ceramic stage, which reduce the heat transfer coefficient between the metal base and the ceramic stage in heating or cooling the stage.

In the method of adhering, since the heat conductivity of the adhesive, in general, is low, the device can not enhance enough in heat transfer characteristics in heating or cooling the stage, and can not be used above 150° C., this temperature being almost near softening temperatures of the resin adhesives.

It may be considerable that another method of adhering the stage and base with the metal layer formed of metals such as molybdenum, tungsten, tantalum, nickel, etc., which can temper thermal expansion difference between the ceramic stage and metal base. However, these metal layers show low thermal conductivity of the range of 54–167 W/mK, and the lower coefficient further in a higher temperature so that the heat transfer characteristics could not be improved enough to be required for the heating or cooling.

SUMMARY OF THE INVENTION

An object of the invention is to provide a wafer holding device in which a ceramic stage and a base block are fixed strongly and the joined portion therebetween can show the high heat transfer characteristics.

A wafer holding device of the invention comprises a ceramic stage having a holding top surface and containing one or more electrodes buried in the ceramic body, and a ceramic base block on which the stage is supported integrally, wherein the ceramic base block comprise porous ceramics containing plurality of pores and a metal impregnated in the porous ceramics, the porous ceramics has a thermal expansion coefficient within $3 \times 10^{-6}/°$ C. of the difference from the heat expansion coefficient of the ceramics of the stage, and the ceramic stage is joined with the base block by brazing with aluminum-based braze material.

In the invention, the internal electrodes of the ceramic stage may be used as a dielectric attraction electrode to fix the wafer on the top surface. The internal electrodes may be used as a heating electrode to heat the wafer on the surface of the stage. Also, the internal electrodes may be used as a plasma-generating electrode, to generate plasma.

The ceramic materials of both the stage and the base block are preferably selected from the same kind of ceramics containing as a main component any one of aluminum nitride, silicon nitride, alumina, boron carbide.

The metal filled with the pores in the porous ceramics of the base block may be selected from aluminum and its alloys and indium.

BRIEF DESCRIPTION OF THE DRAWINGS

The present invention is explained in more detail below in reference to the accompanying drawings, in which.

DETAILED DESCRIPTION OF THE PREFERRED EMBODIMENTS

Figure 1A:
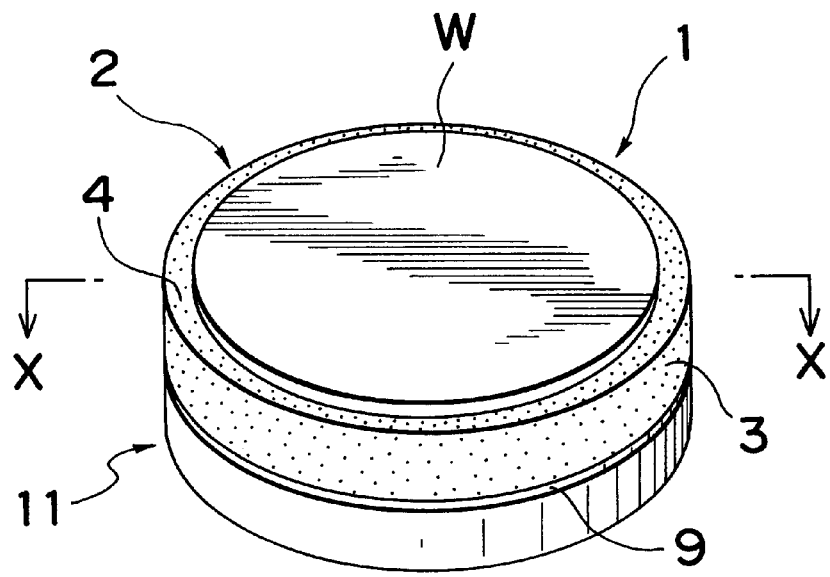
FIG. 1A shows a perspective view of a wafer holding device according to the present invention.
Figure 1B:
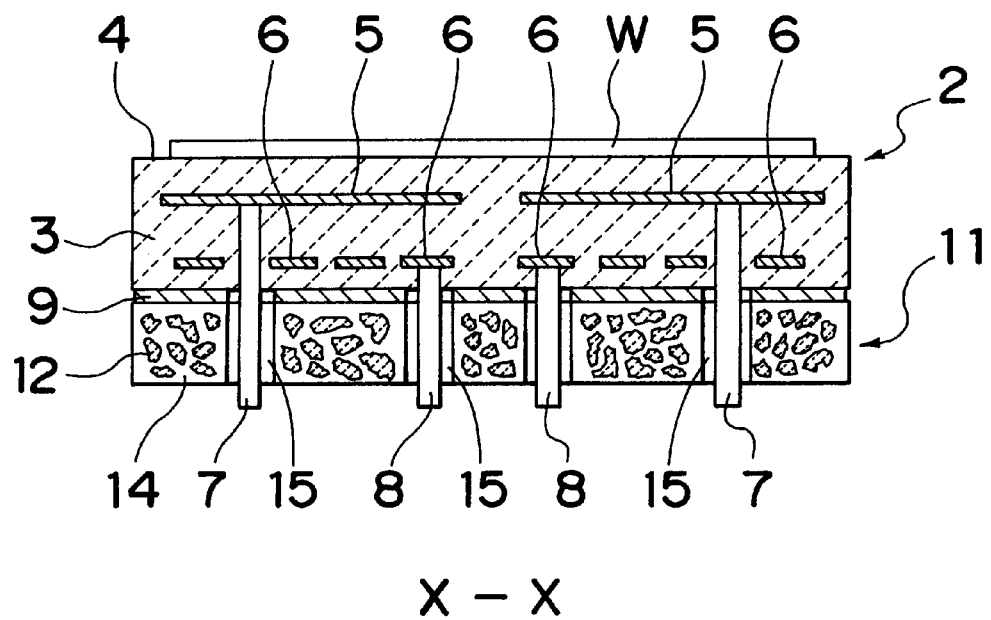
FIG 1B shows a cross sectional view of a wafer holding device in the preferred embodiment of the invention.

FIGS. 1A and 1B show a wafer holding device of a embodiment according to the present invention, in which a wafer holding stage 2, which is used to hold one or more wafers, is formed of a ceramic body 3, in this example, in a disc shape and provided with a flat top surface as a wafer holding plane 4 to amount the wafer W.

Figure 2A:
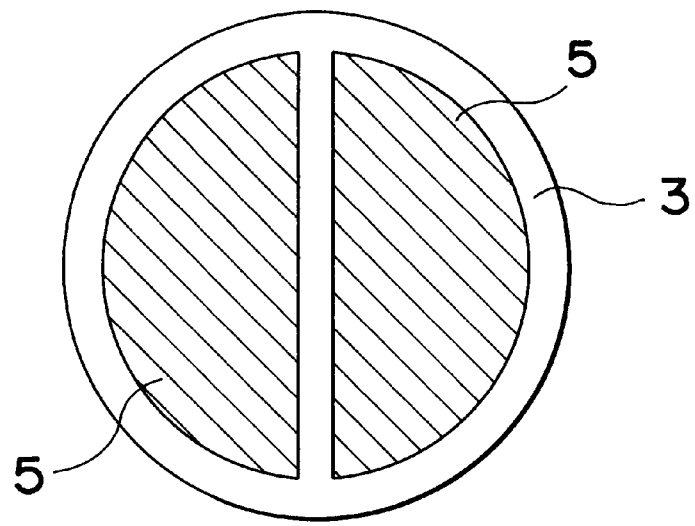
FIGS. 2A and 2B show the patterned electrode buried in the ceramic stage in embodiment of the present invention.
Figure 2B:
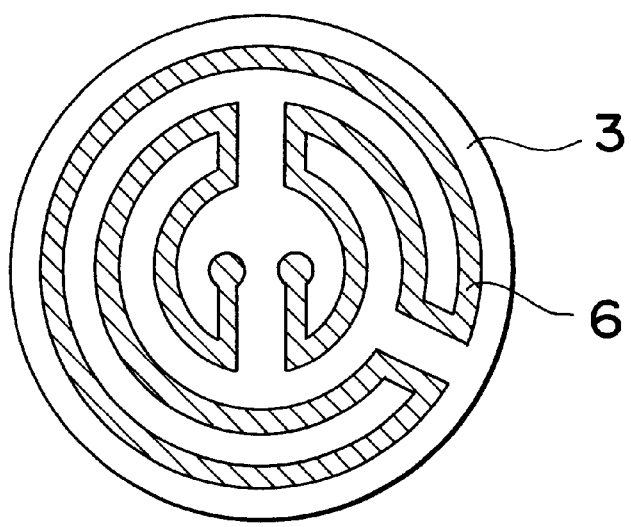

A pair of plate electrodes 5 were buried in the ceramic body 3 for dielectric attraction on the top side near the wafer holding plane 4, and also heater electrodes 6 is buried for heating on the bottom side, both in the ceramic body 3. The dielectric attractive electrodes 5, as shown in FIG. 2A, comprises two semi-circular conductive films which are arranged so as to form a almost circular plane divided by a narrow slot. The heater electrode 6, as shown in FIG. 2B, is composed of plurality of coaxial manifold arc strip lines and straight segmented strip lines connecting with the ends of the arc lines which all made of a electric resistant metal, so as to form a heater to uniformly heat the sectional area of the stage. The stage 2 is provided with through holes from the electrodes 5 and 6 toward the bottom surface and connection terminals 7 and 8 are joined to the electrodes 5 and 6 passing through the through holes to supply the current thereto.

A base block 11 is fixed and joined to the bottom surface of the stage 2, which has a disc shape in almost the same diameter as the stage. The base block 11 is formed of a composite material containing a porous ceramics which has $3\times10^{-6}/°$ C. or less of the difference between the thermal expansion coefficients of the said base block 11 and the stage 2. The composite material comprises said porous ceramic body with pores and a metal 12 filled entirely in all the pores. The base block 11 is formed with through holes 15 which are pierced through the body in the thickness direction and opened on the both sides. In such structure of the base block, the thermal expansion coefficient of the base block 11 is very dependent on that of the ceramic skeleton of the base block, and the thermal conductivity is very dependent on that of the metal impregnated within the skeleton. It is advantageous that the thermal expansion coefficient and thermal conductivity of the base block can be adjusted comfortably, if desired, by controlling mixing proportion of the ceramics and the metal in the block.

In the present invention, the thermal expansion coefficient difference between the base block 11 and the stage 2 is lowered within $3\times10^{-6}/°$ C., by using a porous ceramics for the skeleton structure of the base block having the thermal expansion coefficient near that of the ceramic stage. Particularly, the two ceramics for the base block and the stage may be formed of the same kind of ceramics.

The base block 11 and the stage 13 are joined each other by brazing with a braze material. The low difference of the thermal expansion coefficients between the base block 11 and the stage 2 enables the thermal stress occurring between them in brazing to relax effectively, strengthening the brazed joint between them.

The base block 11 may be a ceramics having lower hardness than the stage, to be machined in a desired shape. This, particularly, allows the base block to be electric-discharge-machined, with electric conductivity given in the block due to the impregnated metal therein.

Containing the metal impregnated, the base block may be used as a plasma generating electrode, in use, the impregnated metal being supplied with high frequency power. Also, the base block may easily be joined to other metal portions of a chamber, such as cooling pipes, metal heaters or a chamber wall.

For the base block, it should be noted that the proportion of the porous ceramics to the metal is preferable be in the range of 50:50 to 80:20 by volume.

As the proportion of the ceramics 14 in the base block 11 is lower than 50% by volume (an amount of the metal 12 exceeds 50% in the block), the strength of the base block is remarkably decreased, and the thermal expansion coefficient of the block is largely dependent on the metal, rather than the ceramic skeleton, then resulting in the large difference of the thermal expansion coefficients therebetween. On the contrary, as the proportion of the ceramics 14 in the base block 11 is greater than 80% by volume (the amount of the metal 12 is lower than 20% in the block), the thermal conductivity is lowered remarkably because of the less porosity and also amount of the filled metals to increase the heat conductivity.

In order to fill the metal in the pores in the ceramic skeleton without any empty pores remaining, the porous ceramics 14 may preferably be used having a mean diameter of the pores in a range of 10 to 100 $\mu$m, and a porosity in a rang of 20 to 50%.

The metal 12 may be filled in the pores by press a molten metal into the porous ceramics 14 which is heated in the press machine. In this case, the surface of the ceramics has been covered with the metal layer. If such metal is highly resistant to a plasma as aluminum or its alloy, the metal, except the metal on the joining surface to back surface of the stage, may remain as it is. The joining surface is machined to remove said metal, prior to joining.

The stage 2 and the base block 11 are joined with a braze layer material 9 which contains aluminum as a main component to fabricate the wafer holding device.

Although the aluminum-based braze material has thermal expansion coefficient $24-27\times10^{-6}/°$ C., which is higher than both the ceramics composing the stage and the porous ceramics composing the base block, both the ceramics are near thermal expansion coefficients within $3\times10^{-6}/°$ C. of their difference so that the stage and the base block can joined strongly and rigidly. Further, the aluminum-based braze material has so high thermal conductivity of 238 W/mK and so high resistance to plasma that the wafer holding device can be applicable to the usage in which it may be exposed in plasma. At the same time, the use of the aluminum-based braze material 9 interposed can increase the heat transfer characteristic between the stage 2 and the base block 11.

The ceramics composing the wafer holding stage 2 is selected from dense ceramics with highly thermal resistance and, particularly, high corrosion resistance with respect to halogen-containing corrosion gases. For those ceramics material, aluminum nitride and boron carbide are preferably used, and particularly, high thermally conductive aluminum nitride and boron carbide may be adopted. For example, the high thermally conductive aluminum nitride preferably has a purity of more than 99%, or further 99.5% of aluminum nitride, and therefore dose not almost contain any grain boundary phases in the sintered compact. Such aluminum nitride ceramics can exhibit high corrosion resistance and plasma resistance.

The high thermally conductive aluminum nitride may contain 1 to 9% by weight of one or more rare earth metal oxides such as $Er_2O_3$, $Y_2O_3$, etc., exhibiting the high heat conductive characteristic of greater than 150 W/mK of thermal conductivity, which is convenient to ceramics for the wafer holding stage 2.

The internal electrodes 5 and 6 buried in the ceramics of the stage 2 may be formed with a material having thermal expansion coefficient near that of the ceramics 3 of the stage 2. For the internal electrodes 5 and 6, high melting temperature metals such as tungsten, molybdenum, etc. and their alloys, and metal carbides and nitrides such as tungsten carbide, titanium carbide, titanium nitride, and the like may be used. The internal electrodes may be formed in a shape of film, thin plate or mesh of the metal foil, or strip. The pattern of the electrodes 5 and 6 are selected free, not limited to that as shown in FIGS. 2A and 2B.

On the other hand, in the base block, the ceramic skeleton composing the block may be selected from the ceramic materials having a thermal expansion coefficient near that of the ceramics of the wafer holding stage 2, or from the same kind of ceramic materials as the ceramics of the wafer holding stage 2. In this specification, the terms "the same kind of ceramic material" means the ceramics having the same major component, such as $Al_2O_3$, AlN, SiC, $Si_2N_3$, etc.

Further, for the base block, as the metal 14 filled in the through holes, aluminum and indium may be selected. To improve capability of filling the metal 14, an aluminum alloy which contains silicon may preferably be used for the metal. In the case of using such an aluminum alloy as a filling metal 14, oxide films may be formed on the surface of the metal without any trouble.

In the wafer holding device in this embodiment, as shown in FIGS. 1A and 1B, the wafer holding stage 2 has been provided with dielectric attraction electrodes 5 and the a heater electrode 6, but the stage 2 may be provided with at least any one of the dielectric attraction electrodes 5, heater electrode and a plasma generating electrode, or otherwise may be provided with all of these electrodes.

EXAMPLES

Some examples of a wafer holding device according to the present invention are shown below.

In order to fabricate a wafer holding stage, first, a green sheet was prepared. A slip was formed by mixing aluminum nitride powder with mean grain size of 1.2 μm and purity over 99.9%, a binder, and a solvent, being used to make green sheets having a thickness of about 0.4 mm by tape casting such as doctor-blade technique, etc.

On one of two green sheets, a metal past was printed using a printing machine, in order to make patterned films as shown in FIGS. 2A and 2B for electrodes. The metal past was prepared adjusting viscosity from a powder mixture of aluminum nitride and tungsten, the tungsten powder having specific surface area of more than 2 $m^2/g$ in an amount of about 15% by weight in the powder mixture.

The printed green sheet and another green sheet were laminated by thermo-pressing at 80° C. and at a pressure of 50 kg/cm² to form a green ceramic laminate, which then was machined to a disc. The ceramic disc was degreased in a vacuum, and then was sintered at a temperature of about 2000° C. in a vacuum, resulting in a sintered disc-shaped ceramic body of aluminum nitride with purity of 99.9%, thermal conductivity 60 W/mK, and thermal expansion coefficient $5 \times 10^{-6}/°$ C., which is provided with electrodes 5 and 6 for heating and dielectric attraction.

The disc-shaped ceramic bodies thus obtained were ground on a top surface to be flat on the side of the attraction electrode 5 to form a wafer holding surface, and were bored on the other side to form some holes which reached the two buried electrodes 5 and 6. Then, current supplying terminals 7 and 8 were inserted to the holes, connecting to the corresponding electrodes. Thus, the wafer holding stages 2 were formed.

On the other hand, in order to produce a base block, first, granules were prepared by spraying a wet mixture of an aluminum nitride (AlN) powder with purity 85% and a mean grain size of 80 μm, a silicon oxide ($SiO_2$) powder, an organic binder and a solvent using a spray-dryer. The disc compacts were pressed from the granules by using rubber press technique, and then were sintered in a vacuum at 1200° C., which is lower than the ordinary sintering temperature, to obtain porous ceramics body with a porosity of about 50% and mean pore diameter of about 80 μm.

In order to impregnate a metal into the pores of the porous ceramics, first, the ceramic was interposed between the dies of a press machine and heated up to 680° C. Then, molten aluminum with purity of 99% was poured into the dies and pressed by pushing punches to the dies at a pressure of about 100 kg/cm², and thereafter was cooled in the pressurized state, obtaining a ceramic body with aluminum impregnated in the pores. Thus, a base block 11 was produced of the aluminum-filled ceramic body, which was ground to form a flat surface on the block for a joining plane to the stage.

Figure 3:
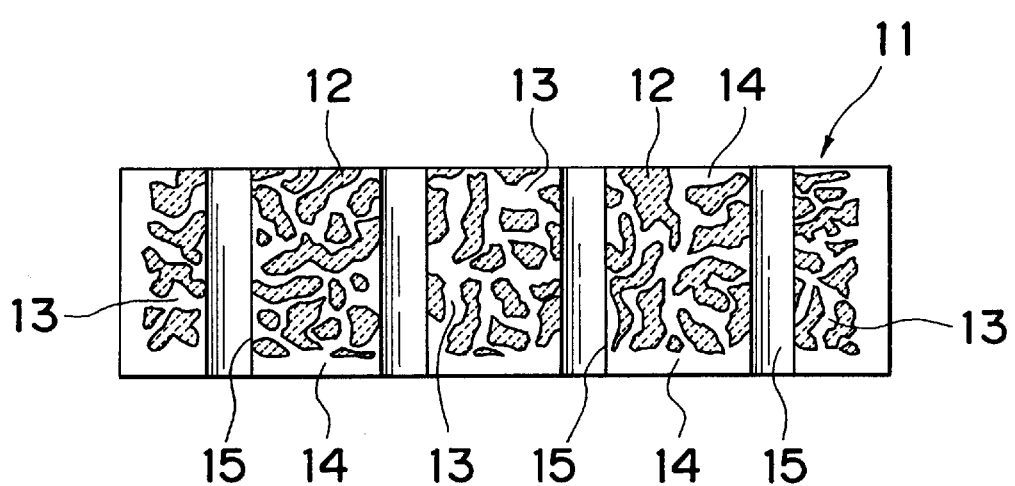
FIG. 3 shows an enlarged cross sectional view of the base block in another embodiment, relating to a wafer holding device as shown in FIG. 1B.

In this step of producing the base block 11, a ceramic body covered with a aluminum layer on the periphery, as shown in FIG. 3, may be obtained by designing the dies to set a proper melt-filling clearance between inner surface of the dies and outer surface of the ceramic body to fill the aluminum melt in impregnating the porous ceramics.

In order to fabricate a wafer holding device 1, the stage 2 and the base block 11 were joined with a braze material 9, wherein the stage was placed on a metallic paste attached to the joining plane of the block. Then, they all heated at about 550° C. The metallic paste was prepared from a paste-like mixture of powder of an aluminum alloy (JIS AC9B alloy) with a binder.

Experiments

With respect to the wafer holding device in the above embodiment, experiments were conducted to investigate joint characteristics and heat transfer property at the joint portion of the base block 11 and the wafer holding stage 2, by varying the mixing proportion of the ceramics and metal contained in the base block and thermal expansion coefficient differences between the base block and the stage.

For determining the heat transfer characteristic, the wafer holding device was welded and mounted on the aluminum plate having cooling function, incorporated into a CVD system using helicon waves as plasma source. In the CVD system to be in a plasma state, the wafer holding stage 2 was heated by supplying the alternative current of 80 V of 60 Hz to the heater electrodes 6 buried in the stage 2.

Heat transfer coefficient X was calculated from the following equation;

$$X = Q/(S \cdot \Delta T)$$

where, Q is heat amount supplied for a unit time to heat the stage 2 by the electric power, S is a joint area of the stage 2 to the base block 11, and ΔT is a temperature difference between the stage and the base block in the joint portion. Table 1 shows the experimental results with relation to mixing proportion of the ceramics and metal in the base block.

TABLE 1

| | composition base block (wt %) | | thermal expansion coef. ($\times 10^{-6}/°$ C.) | | thermal expansion coef. difference ($\times 10^{-6}/°$ C.) | | heat transfer coef. X |
|---|---|---|---|---|---|---|---|
| No. | AlN | Al | stage | base block | | joint | (W/m²K) |
| 1 | 90 | 10 | 5 | 6 | 1 | good | 200 |
| 2 | 70 | 30 | 5 | 7 | 2 | good | 450 |
| 3 | 50 | 50 | 5 | 8 | 3 | good | 500 |
| 4 | 40 | 60 | 5 | 9 | 4 | poor | — |
| 5 | 30 | 70 | 5 | 11 | 6 | poor | — |

From these results, it is found that the ceramic stage 2 for holding a wafer and the base block 11 of ceramics-metal composite can be bonded strongly with each other by setting the thermal expansion coefficient difference between the stage 2 and the base block 11 to $3 \times 10^{-6}/°$ C. or less.

However, the base block 11 (Sample No 1) in the mixing proportion 90:10 of ceramics to the metal reduces in heat transfer coefficient to 200 w/mK because of the small amount of metal in the base block. On the contrary, the base block of the proportion in a range of 50:50 to 80:20 by volume have high heat transfer coefficient of 450 to 500 w/mK. Therefore, for the material of the base block, the proportion of ceramics to metal my preferably be in a range between 50:50 and 80:20 by volume.

As mentioned above, since a wafer holding device of the present invention is formed from the ceramic stage for holding a wafer and a base block of the metal-ceramic composite having its thermal expansion difference from the stage within $3 \times 10^{-6}/°$ C., the device can be readily fabricated by readily and strongly brazing layer the base block and the ceramic stage with a high thermally conductive aluminum alloy used as a braze metal material, and can show high heat transfer property from the stage to the base block, homogenizing the temperature distribution in a entire surface area of the stage for mounting the wafer.

Therefore, the wafer holding device of the present invention can be used in the filmmaking, formation or exposure processes for producing semiconductor devices, improving accuracy of filmmaking, formation or exposure, respectively, for producing semiconductor devices.

What is claimed is:

1. A wafer holding device, comprising a wafer holding stage of ceramics having at least one internal electrode and a top surface on which at least a wafer is to be mounted, a base block supporting said stage integrated thereto, and a braze material layer to join the stage and the base block between which the layer is interposed, wherein the base block is formed of a porous ceramics and a metal filled in pores of a bulk of the ceramics, a thermal expansion coefficient of the base block is within $3 \times 10^{-6}/°$ C. of a thermal expansion coefficient of the stage, and the braze material layer comprises an aluminum-based braze material.

2. A wafer holding device according to claim 1, wherein each of the internal electrodes is selected from the group consisting of a dielectric attraction electrode, a heating electrode and a plasma-generating electrode.

3. A wafer holding device according to claim 1 or 2, wherein the ceramics of said stage and the porous ceramics of the base block comprise a same ceramics as a main component containing any of aluminum nitride, silicon nitride, alumina, boron carbide, and the metal filled into the pores of the porous ceramics of the base block is aluminum or its alloy or indium.

4. A wafer holding device according to claim 1 or 2, wherein the ceramics of said stage and the porous ceramics of the base block comprise a same kind of ceramics as a main component containing any one of aluminum nitride, silicon nitride, alumina and boron carbide, and the metal filled in the porous ceramics is aluminum or its alloy.

5. A wafer holding device according to any one of claims 1 or 2, wherein the mixing proportion of the porous ceramics to the metal in the base block is in a range of 50:50 to 80:20 by volume.

6. A wafer holding device according to any one of claims 1 or 2, wherein the porous ceramics of the base block having a mean diameter of the pores in a range of 10 to 100 $\mu$m and a porosity in a range of 20 to 50%.

7. A wafer holding device according to any one of claims 1 or 2, wherein the base block has a function as a electrode for emitting plasma.

\* \* \* \* \*